United States Patent
Grill et al.

(10) Patent No.: US 8,212,337 B2
(45) Date of Patent: Jul. 3, 2012

(54) ADVANCED LOW K CAP FILM FORMATION PROCESS FOR NANO ELECTRONIC DEVICES

(75) Inventors: Alfred Grill, White Plains, NY (US); Joshua L. Herman, Troy, NY (US); Son Nguyen, Schenectady, NY (US); E. Todd Ryan, Clifton Park, NY (US); Hosadurga K. Shobha, Niskayuna, NY (US)

(73) Assignees: International Business Machines Corporation, Armonk, NY (US); Globalfoundries Inc., Grand Cayman (KY)

( * ) Notice: Subject to any disclaimer, the term of this patent is extended or adjusted under 35 U.S.C. 154(b) by 970 days.

(21) Appl. No.: 11/972,175

(22) Filed: Jan. 10, 2008

(65) Prior Publication Data

US 2009/0179306 A1    Jul. 16, 2009

(51) Int. Cl.
*H01L 23/58* (2006.01)
*H01L 23/48* (2006.01)

(52) U.S. Cl. .................. 257/632; 257/635; 257/762

(58) Field of Classification Search .................. 257/632, 257/635, 639, 762, E23.141
See application file for complete search history.

(56) References Cited

U.S. PATENT DOCUMENTS

| | | | |
|---|---|---|---|
| 6,875,687 B1 | 4/2005 | Weidman et al. | |
| 6,887,783 B2 | 5/2005 | Chen et al. | |
| 6,917,108 B2 * | 7/2005 | Fitzsimmons et al. | 257/751 |
| 7,019,399 B2 * | 3/2006 | Venkatraman et al. | 257/751 |
| 7,135,398 B2 | 11/2006 | Fitzsimmons et al. | |
| 7,749,892 B2 * | 7/2010 | Bonilla et al. | 438/624 |
| 2006/0148252 A1 | 7/2006 | Loboda et al. | |
| 2007/0020451 A1 | 1/2007 | Padiyath et al. | |

OTHER PUBLICATIONS

Liniger, E., et al. "Effect of oxygen at the Cu—SiCxNy interface on Electromigration" Thin Solid Films 513 2006 (295).

* cited by examiner

*Primary Examiner* — Hung Vu

(74) *Attorney, Agent, or Firm* — Scully, Scott, Murphy & Presser, P.C.; Louis J. Percello, Esq.

(57) ABSTRACT

A carbon-rich silicon carbide-like dielectric film having a carbon concentration of greater than, or equal to, about 30 atomic % C and a dielectric constant of less than, or equal to, about 4.5 is provided. In some embodiments, the dielectric film may optionally include nitrogen. When nitrogen is present, the carbon-rich silicon carbide-like dielectric film has a concentration nitrogen that is less than, or equal, to about 5 atomic % nitrogen. The carbon-rich silicon carbide-like dielectric film can be used as a dielectric cap layer in an interconnect structure. The inventive dielectric film is highly robust to UV curing and remains compressively stressed after UV curing. Moreover, the inventive dielectric film has good oxidation resistance and prevents metal diffusion into an interconnect dielectric layer. The present invention also provides an interconnect structure including the inventive dielectric film as a dielectric cap. A method of fabricating the inventive dielectric film is also provided.

19 Claims, 2 Drawing Sheets

ADVANCED LOW K CAP FILM FORMATION PROCESS FOR NANO ELECTRONIC DEVICES

FIELD OF THE INVENTION

The present invention relates to semiconductor interconnect structures for nano integrated circuit devices and a process for fabricating the same. More particularly, the present invention relates to a low k dielectric film that serves as a dielectric cap of an interconnect structure and a method of fabricating the low k dielectric film.

BACKGROUND OF THE INVENTION

Integrated circuits (ICs) typically include a plurality of semiconductor devices and interconnect wiring. Networks of metal interconnect wiring typically connect the semiconductor devices from the semiconductor portion of the substrate. Multiple levels of metal interconnect wiring above the semiconductor portion of the substrate are connected together to form a back-end-of-the-line ("BEOL") interconnect structure. Within such a structure, metal lines run parallel to the substrate and conductive vias run perpendicular to the substrate; the conductive vias typically interconnect the different levels of the metal wiring levels.

Two developments in the last decade have contributed to increased performance of contemporary ICs. One such development is the use of copper Cu as the interconnect metal of the BEOL interconnect structure. Copper is advantageous because it has a higher conductivity compared with the other traditionally used interconnect metals, such as, for example, aluminum Al.

A second development is the employment within the BEOL interconnect structure of a low dielectric constant (Low k) dielectric material as the interlevel dielectric (ILD) layers. By "low k", it is meant a dielectric material whose dielectric constant is less than silicon dioxide. The low k dielectric alternatives may be non-porous, porous or a combination of porous and non-porous.

When copper Cu is used as the metal in the interconnect wiring layers, a dielectric barrier layer or "dielectric cap" is typically required between the copper features and the ILD to prevent copper from diffusing into certain types of ILD materials so as to prevent the copper from damaging the electrical properties of the dielectric.

Under certain circumstances, semiconductor chips may be subjected to external stresses, either during the manufacture or packaging of the chips, or when the packaged chips are mounted or installed in an electronic system for subsequent use. Occasionally, such external stresses can cause cracking and delamination of dielectric materials and metal films embedded in the dielectric materials. Difficulties reside in finding appropriate materials and manufacturing processes which permit copper metal lines to be utilized in certain types of low k dielectric materials, particularly when high stress conditions are present.

Currently, $SiCN_xH$ films are used as the dielectric barrier layer or "dielectric cap" in 90 nm complementary metal oxide semiconductor (CMOS) electronic devices. For Cu-containing interconnect structures in nano integrated circuit devices, a requirement for the next generations of device technology entails a significant reduction in the capacitance of the dielectric barrier layer compared to existing $SiCN_xH$ films.

Prior art $SiCN_xH$ films are good Cu cap layers despite having a dielectric constant between 5.0 and 5.5 and a high capacitance. Furthermore, the stress of prior art $SiCN_xH$ films changes from compressive to tensile under subsequent post processing steps such as, for example, UV curing or E-beam curing of the ILD dielectrics. This change in stress of prior art $SiCN_xH$ films under subsequent post processing steps causes significant cracking and thus limits the use of $SiCN_xH$ films.

In view of the above, there is a need for providing a dielectric barrier layer, i.e., dielectric cap, that has a lower dielectric constant than existing $SiCN_xH$ films, and maintains a compressive stress even under subsequent post deposition processing.

SUMMARY OF THE INVENTION

The present invention provides a low cost, highly stable, low k dielectric cap for use in advanced interconnect structures which reduces the overall effective capacitance of the structure and hence, in turn, increases the device performance, while maintaining its' compressive stress even after performing a subsequent post processing step such as, for example, UV curing or E-beam curing. That is, the present invention provides a stable low k dielectric film with high UV post treatment stability.

More particularly, the present invention provides a carbon-rich low k dielectric film that includes atoms of at least Si, C and H, and optionally nitrogen. The inventive carbon-rich low k dielectric film, which can also be referred to as a carbon-rich silicon carbide-like film, is useful as a low k dielectric cap in interconnect structures, particularly in advanced interconnect structures that include copper as an embedded conductive material. The inventive low k dielectric cap, i.e., the carbon-rich silicon carbide-like film including atoms of at least Si, C and H, and optionally nitrogen, has improved UV stability and a dielectric constant of less than, or equal to, about 4.5. Moreover, the inventive carbon-rich silicon carbide-like film maintains a typically compressive stress even after exposure to UV treatment or another high energy post deposition treatment step.

The term "carbon rich" when used in conjunction with the inventive low k dielectric film denotes that the inventive low k dielectric film has a carbon content of greater than, or equal to, about 30 atomic % C, with a carbon content from about 35 to about 60 atomic % C being even more preferred.

In general terms and in one aspect of the invention, a dielectric film is provided that comprises atoms of at least Si, C and H having a dielectric constant of less than, or equal to, about 4.5, said C atoms are present in a concentration of greater than, or equal to, about 30 atomic % C. In the inventive film, silicon atoms are present in a concentration less than, or equal to, about 30 atomic % Si and the hydrogen atoms are present in a concentration of less than, or equal to, about 40 atomic % H.

In one embodiment of the present invention, the dielectric film further includes nitrogen atoms. In this embodiment of the present invention, the inventive dielectric film (i.e., the carbon-rich silicon carbide-like nitrogen-containing film) includes nitrogen atoms in a concentration of less than, or equal, to about 5 atomic % nitrogen, with a nitrogen concentration from about 2 to about 4 atomic % nitrogen being more preferred. In some embodiments, the nitrogen may be uniformly distributed throughout the entire low k dielectric film, while in yet other embodiments the nitrogen concentration is provided in selected regions within the inventive carbon-rich silicon carbide-like film providing a graded, in terms of nitrogen content, dielectric film.

In some further embodiments of the present invention, the inventive low k dielectric film has a dielectric constant from about 2.5 to about 4.0.

It is noted that the inventive carbon-rich silicon carbide-like film has compressive stress after deposition. Moreover, the inventive carbon-rich silicon carbide-like film is highly robust to a subsequent post deposition treatment step such as UV or E-beam curing and remains compressively stressed even after said post deposition treatment step. The inventive carbon-rich silicon carbide-like film is highly resistant to oxidation and has good Cu diffusion barrier properties.

In another aspect of the present invention, a semiconductor structure, such as, for example, an interconnect structure, is provided that includes the inventive dielectric film as a low k dielectric cap. By "dielectric cap" it is meant a dielectric material that is located on an exposed surface of an interconnect dielectric material, a conductive material, or both.

In particular, an interconnect structure is provided that comprises:
at least one interconnect dielectric material having a conductive material located therein; and
a dielectric cap comprising at least atoms of Si, C and H having a dielectric constant of less than, or equal to, about 4.5 located on an exposed surface of at least one of said conductive material and said at least one interconnect dielectric material, said dielectric cap having a carbon concentration of greater than, or equal to, about 30 atomic % C. The preferable lower limit for the cap film is 35 atomic %.

In one embodiment of the present invention, the dielectric cap further includes nitrogen atoms. In this embodiment of the present invention, the inventive dielectric cap includes nitrogen atoms in a concentration of less than, or equal to, about 5 atomic % nitrogen, with a nitrogen concentration from about 2 to about 4 atomic % nitrogen being more preferred. In some embodiments, the nitrogen may be uniformly distributed throughout the entire dielectric cap, while in yet other embodiments the nitrogen concentration is provided in selected regions within the inventive dielectric cap providing a graded, in terms of nitrogen content, dielectric film.

In some embodiments, the dielectric cap is a single layer. In yet other embodiments, the dielectric cap is a bilayer including a lower layer of $SiNH_x$ or $SiNC_xH_y$ which is in contact with the metal (Cu) surface, while the inventive dielectric cap film is located on top of the lower layer and serves as an effective etch stop, Cu diffusion and oxidation barriers.

In addition to the above, the present invention also provides a method of fabricating the inventive dielectric film which can be incorporated within any interconnect processing scheme, including single damascene and dual damascene.

In general terms, the method of the present invention comprises:
providing at least a carbon-rich carbosilane precursor into a reactor chamber; and
depositing a dielectric film comprising atoms of at least Si, C and H having a dielectric constant of less than, or equal to, about 4.5 from the carbon-rich carbosilane precursor onto a surface of a substrate, said dielectric film having a carbon concentration of greater than, or equal to, about 30 atomic % C.

By "carbon-rich carbosilane precursor" it is meant any compound such as, for example, alky silanes, cycloalkylsilanes, alkylvinylsilanes or cycloalkylphenylsilanes that contains carbon to silicon bonds wherein the number of carbon atoms present in the compound are greater than the number of silicon atoms. Typically, the carbon-rich carbosilane precursor employed in the present invention contains a 3:1 or greater, preferably 5:1 or greater, ratio of C to Si atoms.

In some embodiments of the invention, the method includes the formation of a dielectric film that also includes nitrogen. In this embodiment, the nitrogen is present in the inventive dielectric film in a concentration of less than, or equal to, about 5 atomic % nitrogen. When nitrogen is incorporated into the inventive low k dielectric film, a nitrogen-containing precursor including at least one nitrogen source is used in conjunction with the carbon-rich carbosilane precursor.

In further embodiments of the present invention, the method occurs in a reactor chamber of a plasma enhanced chemical vapor deposition apparatus.

In yet another embodiment of the present invention the carbon-rich carbosilane precursor comprises dimethylsilacyclopentene. In yet a further embodiment of the present invention, the carbon-rich carbosilane precursor comprises dimethylsilacyclopentene and a nitrogen-containing precursor comprising $NH_3$ is employed.

DETAILED DESCRIPTION OF THE INVENTION

Figure 1A:
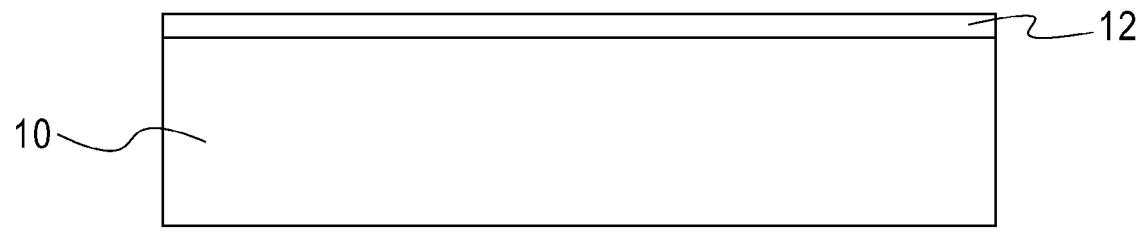
FIGS. 1A-1B are pictorial representations (through cross sectional views) illustrating structures including the inventive low k dielectric film atop a substrate.

The present invention, which provides a low k dielectric cap, an interconnect structure including the same and methods of fabricating the low k dielectric film and the interconnect structure, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a low cost, highly stable, low k dielectric cap for use in advanced interconnect structures. The inventive low k dielectric cap reduces the overall effective capacitance of the structure and hence, in turn, increases the device performance, while maintaining its' compressive stress even after performing a subsequent post processing step such as, for example, UV curing or E-beam curing. That is, the present invention provides a stable low k film with high UV post treatment stability.

More particularly, the present invention provides a carbon-rich low k dielectric film that includes atoms of at least Si, C and H, and optionally nitrogen. In some embodiments of the present invention, the inventive film consists essentially of Si, C and H, and optionally nitrogen. In yet other embodiments, the inventive film consists of Si, C and H, or Si, C, H and N.

The inventive carbon-rich dielectric film, which can also be referred to as a carbon-rich silicon carbide-like film, is useful as a low k dielectric cap in interconnect structures, particularly in advanced interconnect structures that include copper as an embedded conductive material. The inventive low k dielectric cap, i.e., the carbon-rich silicon carbide-like film including atoms of at least Si, C and H, and optionally nitrogen, has improved UV stability and a dielectric constant of less than, or equal to, about 4.5. Moreover, the inventive carbon-rich silicon carbide-like film maintains an initial stress (typically compressive) even after exposure to UV treatment.

Figure 1B:
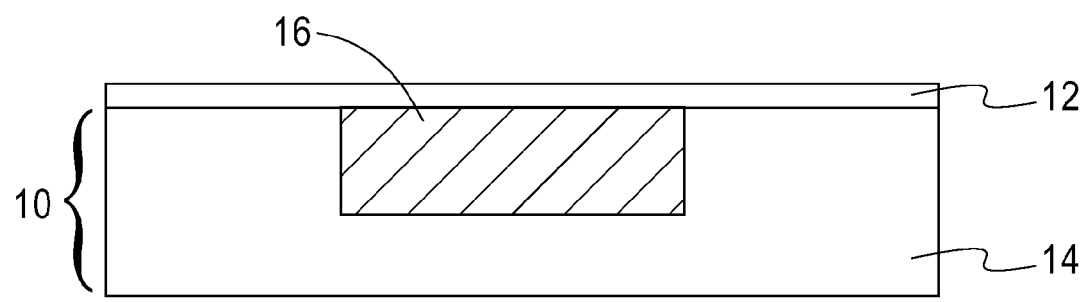

The present invention will now be described in greater detail by referring to FIGS. 1A-1B. Specifically, and in reference to FIG. 1A, the inventive low k dielectric film 12 is formed on a surface of a substrate 10. The term "substrate" when used in conjunction with substrate 10 includes, a semiconducting material, an insulating material, a conductive material or any combination thereof, including multilayered structures. Thus, substrate 10 may be a semiconducting material such as Si, Ge, SiGe, SiGeC, SiC, GaAs, InAs, InP and other III/V or II/VI compound semiconductors. The semiconductor substrate 10 may also include a layered substrate such as, for example, Si/SiGe, Si/Ge, Si/SiC, silicon-on-insulators (SOIs) or silicon germanium-on-insulators (SGOIs). When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material.

Preferably, substrate 10 is an interconnect level of an interconnect structure that includes an interconnect dielectric 14 having a conductive material 16 such as, for example, Cu, Al or a Cu—Al alloy embedded therein; See FIG. 1B.

The inventive low k dielectric film 12 is typically deposited using plasma enhanced chemical vapor deposition (PECVD). In addition to PECVD, the present invention also contemplates that the low k dielectric film 12 can be formed utilizing chemical vapor deposition (CVD), high-density plasma (HDP) deposition, pulsed PECVD, spin-on application, or other related methods.

The thickness of the inventive dielectric film 12 deposited may vary; typical ranges for the deposited low k dielectric film 12 as used as a dielectric cap are from about 1 to about 200 nm, with a thickness from 5 to about 50 nm being more typical.

The inventive low k dielectric film 12 is formed by providing at least a first precursor (liquid, gas or vapor) comprising atoms of Si, C, and H, and an inert carrier such as He or Ar, into a reactor, preferably the reactor is a PECVD reactor, and then depositing a film derived from said first precursor onto a suitable substrate utilizing conditions that are effective in forming a low k dielectric material.

The first precursor of the present invention which includes atoms of Si, C and H is referred to herein as a carbon-rich carbosilane. By "carbon-rich carbosilane precursor", it is meant any compound such as, for example, alkyl silanes, cycloalkylsilanes, alkylvinylsilanes or cycloalkylphenylsilanes that contains carbon to silicon bonds wherein the number of carbon atoms present in the compound are greater than the number of silicon atoms. Typically, the carbon-rich carbosilane precursor employed in the present invention contains a 3:1 or greater, preferably 5:1 or greater, ratio of C to Si atoms.

The carbon-rich carbosilane precursor can be generally represented as $C_xSiH_y$, where $x>=3$ and $y>=8$. Illustrative examples of carbon-rich carbosilane precursors include but are not limited to dimethylsilacyclopentane, tetramethylsilane, divinyltetramethyl silane, diphenyl methyl silane, and phenyl dimethyl silane. In one embodiment, the preferred carbon-rich carbosilane precursor is dimethylsilacyclopentane.

In some embodiments of the present invention an optional nitrogen or nitrogen-containing second precursor is employed; the optional nitrogen-containing second precursor includes atoms of at least $N_2$ and H, with C being optional. When an optional nitrogen-containing second precursor is employed, the optional nitrogen-containing second precursor introduces nitrogen atoms into the inventive low k dielectric film 12. Non-graded and graded low k films including nitrogen are contemplated. Grading is achieved by varying the amount of nitrogen-containing second precursor introduced into the reactor system.

Examples of nitrogen-containing second precursors that can be used in the present invention include but are not limited to $N_2$, $NH_3$, hexamethyl disilazane, and divinyl tetramethyl disilazane. In one embodiment, $NH_3$ is preferably used as the nitrogen-containing second precursor.

In a highly preferred embodiment of the invention, $NH_3$ is used in conjunction with dimethylsilacyclopentene.

The inventive low k film 12 may be deposited using a method the includes the step of providing a parallel plate reactor, which has a conductive area of a substrate chuck between about 85 cm$^2$ and about 1600 cm$^2$, and a gap between the substrate and a top electrode between about 1 cm and about 12 cm. A high frequency RF power is applied to one of the electrodes at a frequency from about 0.45 MHz to about 200 MHz. Optionally, an additional low frequency power can be applied to one of the electrodes.

The conditions used for the deposition step may vary depending on the desired final dielectric constant of the inventive low k dielectric film 12. Broadly, the conditions used for providing a stable low k dielectric material using a liquid carbon-rich carbosilane precursor include: setting the substrate temperature at a temperature from about 200° C. to about 425° C.; setting the high frequency RF power density within a range from about 0.1 W/cm$^2$ to about 1.5 W/cm$^2$; setting the liquid carbon-rich carbosilane precursor flow rate within a range from about 20 mg/min to about 5000 mg/min, optionally setting the second liquid precursor including a source of nitrogen at flow rate within a range from about 300 mg/min to about 1000 mg/min; optionally setting the inert carrier gases such as helium (or/and argon) flow rate within a range from about 50 sccm to about 5000 sccm; setting the reactor pressure at a pressure within a range from about 1000 mTorr to about 7000 mTorr; and setting the high frequency RF power within a range from about 75 W to about 1000 W. Optionally, an ultra low frequency power may be added to the plasma within a range from about 30 W to about 400 W. When the conductive area of the substrate chuck is changed by a factor of X, the RF power applied to the substrate chuck may also change by a factor of X.

While liquid precursors are used in the above example, it is known in the art that carbon-rich carbosilane gas phase precursors can also be used for the deposition.

The dielectric film 12 formed at this point of the present invention has a covalently bonded random tri-dimensional network or matrix that comprises, consists essentially of or consists of atoms of Si, C, H and optionally N. The tri-dimensional network may include a covalently bonded tri-dimensional structure comprising mostly Si—C, Si—H, Si—N, C—H, C—C and some C—N bonds. Moreover, the inventive as deposited dielectric film 12 has an atomic level nanoporosity. By 'atomic level nanoporosity" it is meant that the film contains various pores in which the pore sizes range in Angstrom (atomic dimension) to nanometer. A typical pore size is 0.3-10 nm in which the preferable pore size is in the range of 0.5 to 2 nm. The pores concentration can be 2 to 35 volume percentage of the film, in which the preferred concentration range is 5 to 15 volume percent.

The as deposited inventive dielectric film 12 also has a dielectric constant of about 4.5 or less, preferably from about 2.5 to about 4.0. Moreover, the as deposited dielectric film 12 is compressively stressed.

As stated above, the inventive low k dielectric film is 'carbon-rich'. By 'carbon rich', it is meant that the inventive low k dielectric film 12 has a carbon concentration of greater than, or equal to, about 30 atomic % C. More preferably, the carbon content in the inventive low k film is from about 35 to about 60 atomic % C. When nitrogen is present in the low k dielectric film 12, the concentration of nitrogen in the film is less than, or equal, to about 5 atomic % nitrogen, with a nitrogen concentration from about 2 to about 4 atomic % nitrogen being more preferred.

In addition to C and optionally N, the inventive carbon-rich low k dielectric film also includes Si and H. Silicon is present in the inventive dielectric film 12 in an amount from about 10 to about 30 atomic % Si, with an amount from about 15 to about 22 atomic % Si being more preferred. Hydrogen is present in the inventive dielectric film 12 in an amount from about 20 to about 40 atomic % H, with an amount from about 30 to about 40 atomic % H being more preferred.

After deposition of the inventive low k dielectric film 12, the deposited film is optionally, but not necessarily always subjected to a curing step that is performed in a non-oxidizing ambient. By "curing" it is meant that the deposited dielectric film 12 is heat treated at a temperature, in at least one of the heating cycles, of not less than 300° C., preferably at a temperature from about 300° to about 420° C., for a time period of at least about 0.10 hour. By "non-oxidizing ambient" it is meant an atmosphere in which the oxygen content is less than 20 ppm, preferably less than 10 ppm. It is noted that curing can occur in the same reactor chamber as used in depositing the inventive dielectric film 12 or curing may be performed in a separate reactor chamber.

This thermal treatment step, i.e., curing, may include a rapid thermal anneal, a furnace anneal, a laser anneal or a spike anneal.

In some embodiments of the present invention, the curing is performed in an oxygen free atmosphere such as, for example an inert gas (e.g., He, Ar or mixtures thereof).

In yet other embodiments of the present invention, the curing step may be performed at a single temperature. In some further embodiments of the present invention, the curing step may occur at two or more different temperatures. For example, the present invention contemplates an embodiment in which curing is performed at a temperature not higher than 300° C. for a first period of time and then at a second temperature not lower than 400° C. for a second period of time, the second period of time being longer than the first period of time. In some embodiments, the second period of time may be at least 10 times greater than the first period of time.

Preferably, the as deposited low k dielectric film 12 can be subjected to a high energy post deposition processing step for shorter curing time. Specifically, the as deposited carbon-rich low k dielectric film 12 of the present invention can be processed using a high energy source. Suitable energy sources that can be used for the post processing step include chemical, ultraviolet (UV) light, electron beam (E-beam), microwave, and plasma; note that the thermal curing step mentioned above is also an example of a high energy source that can be used in the present invention. Combinations of the aforementioned energy sources can also be used in the present invention with a shorter curing time of less than or equal to 5 minutes, in which the shorter UV processing time 30 sec to 1 minute is preferred for a typical 20-50 nm cap film. The post treatment by thermal or high energy UV/E-Beam cure drives up any loosely hydrocarbon that incorporates in the film structure during plasma deposition with the carbon-rich precursor source. This treatment will generate a small amount of nanoporosity in the cap film.

The UV light treatment step is performed utilizing a source that can generate light having a wavelength from about 500 to about 150 nm, to irradiate the substrate while the wafer temperature is maintained at a temperature from about 25° to about 500° C., with temperatures from about 300° to about 420° C. being preferred. Radiation with less than 370 nm is of insufficient energy to dissociate or activate important bonds, so the wavelength range 150-370 nm is a preferred range. Using literature data and absorbance spectra measured on as deposited films, the inventors have found that less than 170 nm radiation may not be favored due to degradation of the SiCOH film. Further, the energy range 310-370 nm is less useful than the range 150-310 nm, due to the relatively low energy per photon from 310-370 nm. Within the 150-310 nm range, optimum overlap with the absorbance spectrum of the as deposited film and minimum degradation of the film properties (such as hydrophobicity) may be optionally used to select a most effective region of the UV spectrum for changing the dielectric film 12 properties.

The electron beam treatment step is performed utilizing a source that is capable of generating a uniform electron flux over the wafer, with energies from about 0.5 to about 25 keV and current densities from about 0.1 to about 100 microAmp/$cm^2$ (preferably about 1 to about 5 microAmp/$cm^2$), while the wafer temperature is maintained at a temperature from about 25° to about 500° C., with temperatures from about 300° to about 450° C. being preferred. The preferred dose of electrons used in the electron beam treatment step is from about 50 to about 500 microcoulombs/$cm^2$, with about 100 to about 300 microcoulombs/$cm^2$ being most preferred.

It is noted that after the above post deposition treatment step has been performed, the inventive carbon-rich low k dielectric film maintains a compressive stress.

Figure 2:
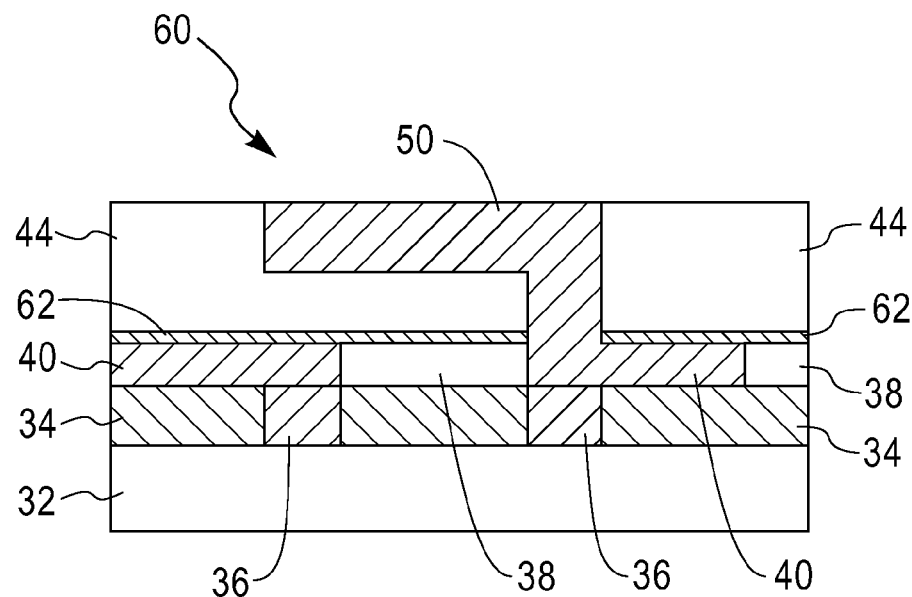
FIGS. 2-4 are a pictorial representation (through are cross sectional views) illustrating some electronic structures including the inventive low k dielectric film as a dielectric cap layer.
Figure 3:
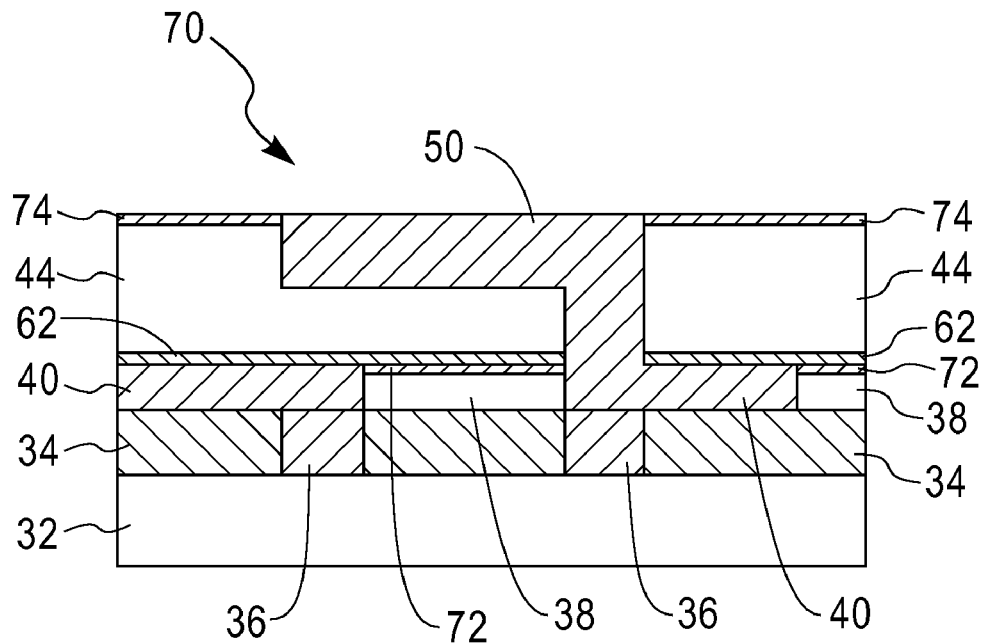
Figure 4:
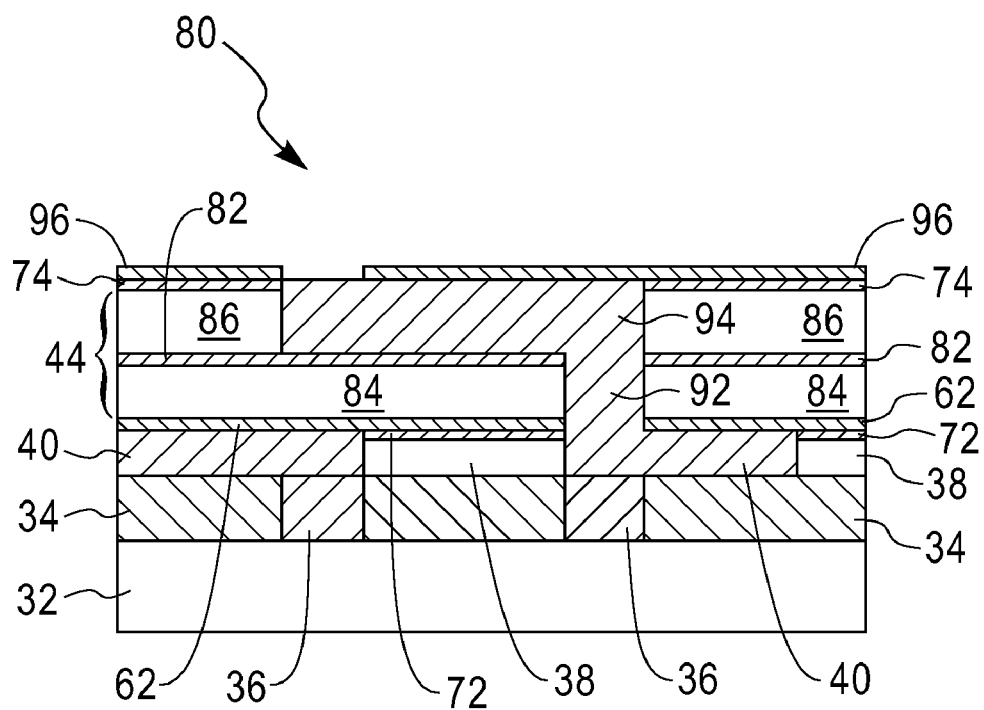

Electronic devices which can contain the inventive carbon-rich dielectric film are shown in FIGS. 2-4. It should be noted that the devices shown in FIGS. 2-4 are merely illustrative examples of the present invention, while an infinite number of other devices may also be formed by the present invention novel methods.

In FIG. 2, an electronic device 60 built on a semiconductor substrate 32 is shown. On top of the substrate 32, a first layer of an interconnect dielectric material 34 is first formed with a first region of metal 36 embedded therein. After a CMP process is conducted on the first region of metal 36, a second layer of interconnect dielectric material 38 is formed on top of the first layer of interconnect dielectric material 34 and the first region of metal 36. The first and second layers of interconnect dielectric material may be suitably formed of silicon oxide, silicon nitride, doped varieties of these materials, SiCOH, spin on dielectric or any other suitable interconnect dielectric material. The second layer of interconnect dielectric material 38 is ten patterned in a photolithography process followed by etching and a conductor layer 40 is deposited thereon. After a CMP process on the conductor layer 40 is carried out, a third layer of an interconnect dielectric material 44 (which may be the same or different dielectric material than the first and second interconnect dielectric layers) is formed overlying the second layer of interconnect dielectric material 38 and the first conductor layer 40. The conductor layer 40 may be a deposit of a metallic material or a nonmetallic conductive material. For instance, a metallic material of aluminum, copper or mixed metallic Cu phases, or a nonmetallic material of nitride or polysilicon or conductive form of carbon. The first conductor 40 is in electrical communication with the first region of metal 36.

A second region of conductor 50 is then formed after a photolithographic process on the second layer of interconnect dielectric material 44 is conducted followed by etching and then a deposition process for the second conductor material. The second region of conductor 50 may also be a deposit of either a metallic material or a nonmetallic material, similar to that used in depositing the first conductor layer 40. The second region of conductor 50 is in electrical communication with the first region of conductor 40 and is embedded in the second layer of the of interconnect dielectric material 44. The second layer of interconnect dielectric material 44 is in intimate contact with the inventive carbon-rich low k dielectric film 38.

FIG. 2 also shows a dielectric cap layer 62 deposited between the second layer of interconnect dielectric material 38 and the third layer of interconnect dielectric material 44. The dielectric cap layer 62 is comprised of the inventive carbon-rich low k dielectric material described above. The dielectric cap layer 62 functions as a diffusion barrier layer for preventing diffusion of the first conductor layer 40 into the interconnect material 44 or into the lower layers, especially into layers 34 and 32.

Another alternate embodiment of the present invention electronic device 70 is shown in FIG. 3. In the electronic device 70, two additional dielectric cap layers 72 and 74 which act as a RIE mask and CMP (chemical mechanical polishing) polish stop layer are used. The first dielectric cap layer 72 is deposited on top of the second layer of interconnect dielectric material 38 and used as a RIE mask and CMP stop, so the first conductor layer 40 and layer 72 are approximately co-planar after CMP. The function of the second dielectric cap layer 74 is similar to layer 72, however layer 74 is utilized in planarizing the second conductor layer 50. The polish stop layer 74 can be deposited of a suitable dielectric material such as silicon oxide, silicon nitride, silicon oxynitride, silicon carbide, silicon carbo-oxide (SiCO), Silicon Carbo-oxynitride (SiCON), or their hydrogenated compounds. Alternatively, the inventive carbon-rich low k dielectric film can be used as the material for polish stop layer 74.

Still another alternate embodiment of the present invention electronic device 80 is shown in FIG. 4. In this alternate embodiment, an additional layer 82 of dielectric material is deposited and thus dividing the third layer of interconnect dielectric material 44 into two separate layers 84 and 86. In one embodiment of the invention, the additional layer 82 off dielectric material includes the inventive carbon-rich low k dielectric material described above. An additional diffusion barrier layer 96 (which may be comprised of the inventive carbon-rich low k dielectric material) is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material a first dielectric cap layer between the second layer of insulating material and the third layer of insulating material and a second dielectric cap layer on top of the third layer of insulating material, wherein the first and the second dielectric cap layers are formed of the inventive carbon-rich low k dielectric film of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the carbon-rich low k dielectric film of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the inventive carbon-rich low k dielectric film.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the carbon-rich low k dielectric film of the present invention.

The following examples are provided to illustrate the fabrication of the inventive low k dielectric cap and to demonstrate some advantages that can be obtained therefrom.

EXAMPLE 1

In this example, a low k dielectric cap film was deposited on a Si wafer utilizing the method of the present application described above. In particular, a low k dielectric film including atoms of Si, C and H was deposited by plasma enhanced chemical vapor deposition (PECVD) utilizing a plasma based on the precursor dimethylsilacyclopentane carried in helium. The as deposited film was mostly carbon rich in composition based on a 6:1 C:Si ratio of the original precursor The deposited film had a dielectric constant of about 2.6-3.6 and it was stable during a subsequent post deposition UV cure treatment step and still maintained compressive stress.

EXAMPLE 2

In this example, a low k dielectric cap film was deposited on a Si wafer utilizing the method of the present application described above. In particular, a low k dielectric film including atoms of Si, C and H was deposited by plasma enhanced chemical vapor deposition (PECVD) utilizing a plasma based on the precursors dimethylsilacyclopentane and $NH_3$ carried in helium. The as deposited film was carbon rich in composition. The deposited film had a dielectric constant of about 3.5-4.5 depending on the nitrogen concentration and it was stable during a subsequent post UV deposition treatment step and still maintain compressive stress.

EXAMPLE 3

In this example, a low k dielectric cap film was deposited on a Si wafer utilizing the method of the present application described above but in a two layer deposition scheme. The bottom layer was deposited in particular, a low k dielectric film including atoms of Si, C and H was deposited by plasma enhanced chemical vapor deposition (PECVD) utilizing a plasma based on the precursors dimethylsilacyclopentane and $NH_3$ carried in helium to form a $SiC_xN_yH_z$ film. The top layer in particular, a even low k dielectric film including atoms of Si, C and H was deposited by plasma enhanced chemical vapor deposition (PECVD) utilizing a plasma based on the precursor dimethylsilacyclopentane carried in helium to form a $SiCH_z$ film. The as deposited bilayer film was mostly carbon rich in composition based on a 6:1 C:Si ratio of the original precursor. The deposited bilayer film had a dielectric constant of about 2.8-4.0 and it was stable during a subsequent post deposition UV cure treatment step and still maintained compressive stress. The bilayer film also had improved oxidation barrier properties due to more Si—N bonding in bottom layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A dielectric film comprising atoms of at least Si, C, N and H having a dielectric constant of less than, or equal to, about 4.5, said dielectric film has a carbon concentration of greater than, or equal to, about 30 atomic % C, and wherein a nitrogen concentration is provided in selected regions within the dielectric film providing a graded, in terms of nitrogen content, dielectric film.

2. The dielectric film of claim 1 wherein said nitrogen is present in said dielectric film in a concentration is from about 2 to about 4 atomic % nitrogen.

3. The dielectric film of claim 1 wherein said dielectric constant is from about 2.5 to about 4.0.

4. The dielectric film of claim 1 wherein said dielectric film has a compressive stress after deposition and after UV or E-Beam or thermal post deposition treatment.

5. The dielectric film of claim 1 wherein said dielectric film has a covalently bonded random tri-dimension network.

6. The dielectric film of claim 1 wherein said carbon concentration is from about 35 to about 50 atomic % C.

7. The dielectric film of claim 1 wherein said nitrogen concentration is less than or equal to about 5 atomic % nitrogen.

8. The dielectric film of claim 1 wherein said silicon is present in a concentration from about 10 to about 20 atomic %.

9. The dielectric film of claim 1 wherein said hydrogen is present in a concentration from about 20 to about 40 atomic %.

10. An interconnect structure comprising:
   at least one interconnect dielectric material having a conductive material located therein; and
   a dielectric Cu diffusion barrier cap comprising atoms of at least Si, C, N and H having a dielectric constant of less than, or equal to, about 4.5 located on an exposed surface of at least one of said conductive material and said at least one interconnect dielectric material, said dielectric cap having a carbon concentration of greater than, or equal to, about 30 atomic % C, and wherein a nitrogen concentration is provided in selected regions within the dielectric cap providing a graded, in terms of nitrogen content, dielectric cap.

11. The interconnect structure of claim 10 wherein said nitrogen is present in said dielectric cap in a concentration is from about 2 to about 4 atomic %.

12. The interconnect structure of claim 10 wherein said dielectric constant of said dielectric cap is from about 2.5 to about 4.0.

13. The interconnect structure of claim 10 wherein said dielectric cap is compressively stressed.

14. The interconnect structure of claim 10 wherein said conductive material comprises Cu or a Cu alloy.

15. The interconnect structure of claim 10 wherein said dielectric cap has a covalently bonded random tri-dimension network.

16. The interconnect structure of claim 10 wherein said carbon concentration of said dielectric cap is from about 35 to about 50 atomic % C.

17. The interconnect structure of claim 10 wherein said nitrogen concentration is less than or equal to about 5 atomic % nitrogen.

18. The interconnect structure of claim 10 wherein said silicon is present in said dielectric cap in a concentration of from about 10 to about 20 atomic % C.

19. The interconnect structure of claim 10 wherein said hydrogen is present in said dielectric cap in a concentration of from about 10 to about 20 atomic % C.

* * * * *